(12) United States Patent
Sekimoto

(10) Patent No.: US 7,061,064 B2
(45) Date of Patent: Jun. 13, 2006

(54) SEMICONDUCTOR DEVICE AND PACKAGE FOR CONTAINING SEMICONDUCTOR ELEMENT

(75) Inventor: Emiko Sekimoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/909,597

(22) Filed: Jul. 20, 2001

(65) Prior Publication Data

US 2002/0074642 A1     Jun. 20, 2002

(30) Foreign Application Priority Data

Jul. 25, 2000    (JP)    ............................ P2000-223736

(51) Int. Cl.
*H01L 31/0203*    (2006.01)
*H01L 23/02*    (2006.01)
*H01L 23/10*    (2006.01)

(52) U.S. Cl. ........................ 257/434; 257/680; 257/710

(58) Field of Classification Search ................ 257/710, 257/434, 680
See application file for complete search history.

(56) References Cited

U.S. PATENT DOCUMENTS

| | | | | |
|---|---|---|---|---|
| 5,371,397 A | * | 12/1994 | Maegawa et al. | ............ 257/229 |
| 5,448,114 A | * | 9/1995 | Kondoh et al. | ............. 257/737 |
| 5,519,252 A | * | 5/1996 | Soyano et al. | ............... 257/690 |
| 5,686,758 A | * | 11/1997 | Arai et al. | ................... 257/668 |
| 5,920,119 A | * | 7/1999 | Tamba et al. | ................ 257/718 |
| 6,281,579 B1 | * | 8/2001 | Siu | ............................. 257/730 |
| 6,384,473 B1 | * | 5/2002 | Peterson et al. | ............ 257/680 |

* cited by examiner

*Primary Examiner*—David E. Graybill
(74) *Attorney, Agent, or Firm*—Robert J. Depke; Trexler, Bushnell, Giangiorgi, Blackstone & Marr, Ltd.

(57) ABSTRACT

To enable to downsize a package for containing a solid-state imaging element relative to a solid-state imaging element having the same size and accordingly, downsize a solid-state imaging device for containing the solid-state imaging element thereto, further, downsize an apparatus such as a video camera or a still camera using the solid-state imaging device, there is provided a package for containing semiconductor element comprising a package having a recess portion for containing a semiconductor element, and a pair of positioning holes and a pair of attaching holes respectively provided at a pair of opposed side portions of the recess portion at surfaces of the package, wherein a line connecting the pair of positioning holes and a line connecting the pair of attaching holes are intersected with each other substantially at a center of the package.

9 Claims, 3 Drawing Sheets a+b+c+(d×2)

$(a/2)+b+c+d$ $[(a/2)+b+c+d] \times 2$

SEMICONDUCTOR DEVICE AND PACKAGE FOR CONTAINING SEMICONDUCTOR ELEMENT

RELATED APPLICATION DATA

The present application claims priority to Japanese Application No. P2000-223736 filed Jul. 25, 2000, which application is incorporated herein by reference to the extent permitted by law.

BACKGROUND OF THE INVENTION

1. Field of the Invention

The present invention relates to a package for containing solid-state imaging device, particularly to a package for containing solid-state imaging device having a substantially rectangular shape, and a solid-state imaging device containing the solid-state imaging element in a package.

2. Description of the Related Art

Generally a solid-state imaging device is contained in a package having a recess portion for containing a solid-state imaging element and provided with leads for electrically leading out respective electrodes of the solid-state imaging element to outside. Specifically, the solid-state imaging element is integrated by subjecting the solid-state imaging device to die bonding above the containing recess portion of the package and electrically connecting the electrodes of the solid-state imaging element and inner ends of the leads by, for example, wire bonding and thereafter sealing the solid-state imaging element by a transparent member.

Further, there is used the package having positioning holes and attaching holes. The positioning holes are for constituting references of positioning when the solid-state imaging element is mounted to the package and the attaching holes are for passing attaching bolts therethrough for attaching the package to a lens cabinet. FIG. 3 is a plane view showing an example of a conventional package for a solid-state imaging element having such positioning holes and attaching holes.

In FIG. 3, numeral 1 designates a package, numeral 2 designates a recess portion for containing a solid-state imaging element and is provided at a central portion of the package 1. Notation "Q" designates a center point of the package 1 (which is also a center point of the recess portion 2). Numerals 3 and 4 designate positioning holes provided on both sides of the recess portion 2 of the package 1 and are arranged in a positional relationship such that a line connecting the positioning hole 3 and the positioning hole 4 are in parallel with one side of the package (long side in FIG. 3). Further, one of the positioning holes 3 and 4 is constituted by an elongated hole elongated in a direction of the connection line.

Numerals 5 and 6 designate attaching holes provided on both sides of a central portion of the recess portion 2 of the package 1 in the height direction and arranged in a positional relationship such that a line connecting the attaching hole 5 and the attaching hole 6 passes through the center "Q" of the package 1 and in parallel with the one side (long side in FIG. 3). The attaching holes 5 and 6 need to be arranged at positions symmetrical with respect to the center "Q" of the package 1 to make screw fastening torque uniform.

In this way, conventionally, as shown by FIG. 3, the package for a solid-state imaging element is arranged with the positioning holes 3 and 4 and the attaching holes 5 and 6 to dispose on a straight line in the horizontal direction or a straight line in the vertical direction of the package 1 and the straight line connecting the positioning holes 3 and 4 and the straight line connecting the attaching holes 5 and 6 are in parallel with each other.

SUMMARY OF THE INVENTION

Meanwhile, the package for containing a solid-state imaging element is requested to be as small as possible to meet request of downsizing an apparatus such as a video camera or a still camera using the solid-state imaging device. However, according to the above-described conventional technology, there is a limit in reducing a size of a package. That is, taking an example of the package 1 shown in FIG. 3, there is produced a useless space on a side of a portion of the package 1 for forming the attaching holes 5 and 6 opposed to a portion of forming the positioning holes 3 and 4 and the presence hampers downsizing of the package 1.

Incidentally, in the case of the conventional example shown in FIG. 3, when a diameter of the attaching holes 5 and 6 is designated by notation "a", an interval to be provided between the attaching holes 5 and 6 and the positioning holes 3 and 4 is designated by notation "b", a diameter of the positioning holes 3 and 4 is designated by notation "c" and a distance to be provided between the positioning holes 3 and 4 and a side of the package 1 is designated by notation "d", a half length of a short side of the package 1 becomes (a/2)+b+c+d. In other words, a length of the short side becomes 2*{(a/2)+b+c+d}.

The present invention has been carried out in order to resolve such problems and it is an object thereof to downsize a package for containing a solid-state imaging element relative to a solid-state imaging device having the same size and accordingly, downsize a solid-state imaging device for containing the solid-state imaging element thereto, further, downsize an apparatus such as a video camera or a still camera using the solid-state imaging device.

The present invention is basically featured in a package for containing semiconductor element comprising a package having a recess portion for containing a semiconductor element, and a pair of positioning holes and a pair of attaching holes respectively provided at a pair of opposed side portions of the recess portion at a surface of the package, wherein a line connecting the pair of positioning holes and a line connecting the pair of attaching holes are intersected with each other substantially at a center of the package.

Therefore, according to the invention, the respective positioning holes and the respective attaching holes are arranged such that the straight line connecting the centers of the positioning holes and the straight line connecting the centers of the attaching holes are intersected with each other at the center of the solid-state imaging device containing package or a vicinity thereof and therefore, there can be eliminated useless space on a side of the attaching hole forming portion opposed to the positioning holes which are present in the conventional example shown in FIG. 3.

Therefore, the size of the package for a solid-state imaging device can be made smaller than that of the conventional one. Incidentally, according to the invention, the short side which needs the length of 2*{(a/2)+b+c+d} as described above in the conventional example shown in FIG. 3, can significantly be shortened to the length of (a+b+c+2d) and the package for a solid-state imaging element can be downsized by that amount.

Further, a surface of both sides of the solid-state imaging element containing portion may be made higher than a surface of a transparent member when the solid-state imaging element is contained in the solid-state imaging element containing portion and the solid-state imaging element is sealed by the transparent member.

When the surface on the both sides of the solid-state imaging element containing portion is made higher than the surface of the transparent member for sealing the solid-state imaging element in the containing portion in this way, when a lens cabinet is attached to a surface of the package, the lens cabinet can effectively be prevented from being brought into contact with the transparent member, further, there can be eliminated a concern that the lens cabinet is attached incorrectly by extruded adhering agent for adhering a back surface of the transparent member to the containing portion.

The present invention is basically featured in a package for containing semiconductor element comprising a package having a recess portion for containing a semiconductor element, and a pair of positioning holes and a pair of attaching holes respectively provided at a pair of opposed side portions of the recess portion at surfaces of the package, wherein a line connecting the pair of positioning holes and a line connecting the pair of attaching holes are intersected with each other substantially at a center of the package and is not featured in a material of the package and various materials can be used such that, for example, ceramic may be used or resin may be used.

Although the positioning hole frequently comprises a through hole generally, it is not indispensable to constitute the positioning hole by the through hole but the positioning hole may be formed by a bottomed hole referred to as recess. Although it is preferable that one of a pair of the positioning holes arranged at positions symmetrical with each other with respect to the center of the package, is formed by a complete circle and other thereof is formed by an elongated hole more or less elongated along a direction of a straight line connecting centers of the pair of positioning holes, such a constitution is not indispensable.

Further, a surface of both sides of the solid-state imaging element containing portion may be made higher than a top surface of a transparent member for sealing the solid-state imaging element in the containing portion. Because when a lens cabinet is attached to a surface of the package, the lens cabinet can effectively prevented from being brought into contact the transparent member, further, there can be eliminated a concern that the lens cabinet is attached incorrectly by extruded adhering agent for adhering a bottom surface of the transparent member to the containing portion.

The solid-state imaging element contained in the package may naturally be a CCD solid-state imaging element, may be an MOS type solid-state imaging element or may be an amplifying type solid-state imaging element, further, the solid-state imaging device containing the solid-state imaging element to the package, may be for a video camera or may be for a still camera and its application is not limited.

DETAILED DESCRIPTION OF THE PREFERRED EMBODIMENTS

A detailed explanation will be given of the invention in accordance with an illustrated embodiment as follows.

Figure 1:
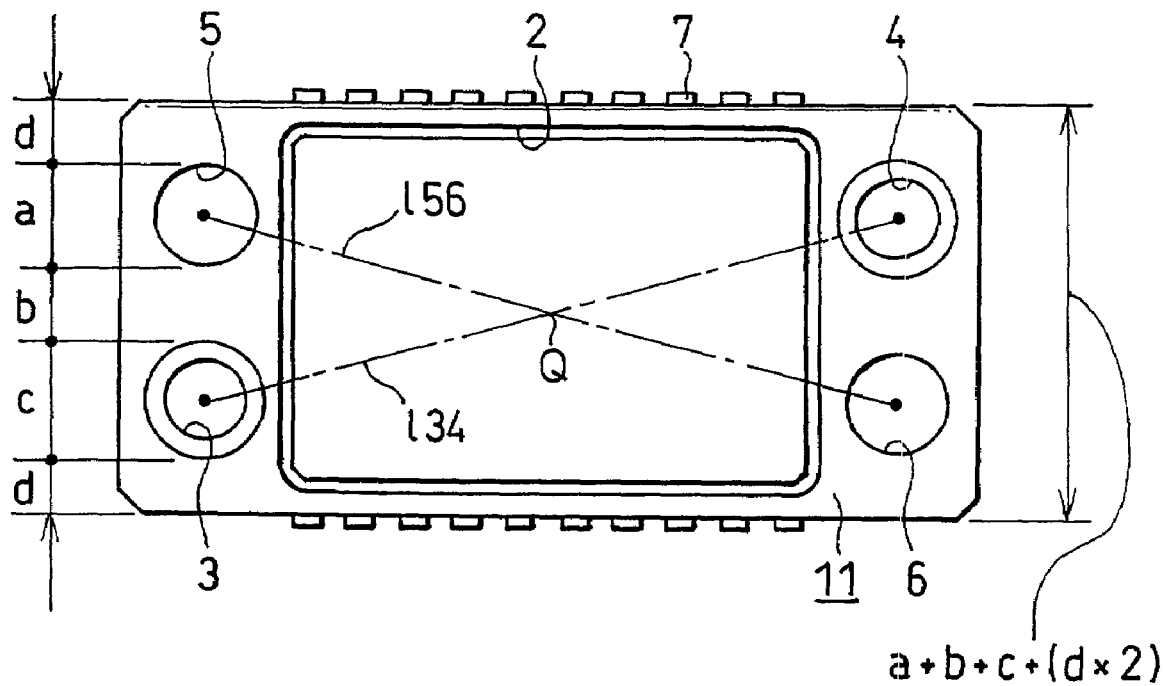
FIG. 1 is a plane view showing an embodiment of a package for containing a solid-state imaging element according to the invention.

FIG. 1 is a plane view showing an embodiment of a package for containing a solid-state imaging element according to the invention. In the drawing, numeral 11 designates a package for containing a solid-state imaging element. An upper face of the package 11 constitutes a reference face in positioning and position detecting in an optical axis direction when a solid-state imaging device is attached to, for example, a lens cabinet after containing a solid-state imaging element. Numeral 2 designates a recess portion for containing the solid-state imaging element and is provided at a central portion of the package 11. Notation "Q" designates a central point of the package 11 (which is also a central point of the recess portion 2). Numerals 3 and 4 designate positioning holes provided on both sides of the recess portion 2 and are arranged in a positional relationship such that a straight line 134 connecting the positioning hole 3 and the positioning hole 4 passes through the center of the package 1 and is skewed relative to the horizontal direction and the vertical direction. Further, one of the positioning holes 3 and 4 is constituted by an elongated hole prolonged in a direction of the line $1_{34}$.

Numerals 5 and 6 designate attaching holes provided on the both sides of the recess portion 2 and arranged in a positional relationship such that a straight line $1_{56}$ connecting the attaching holes 5 and 6 passes through the center "Q" of the package 1, skewed relative to the horizontal direction and the vertical direction and intersects with the line $1_{34}$. Numeral 7 designates a lead for electrically leading out an electrode of the solid-state imaging element to outside of the package 11.

Figure 3:
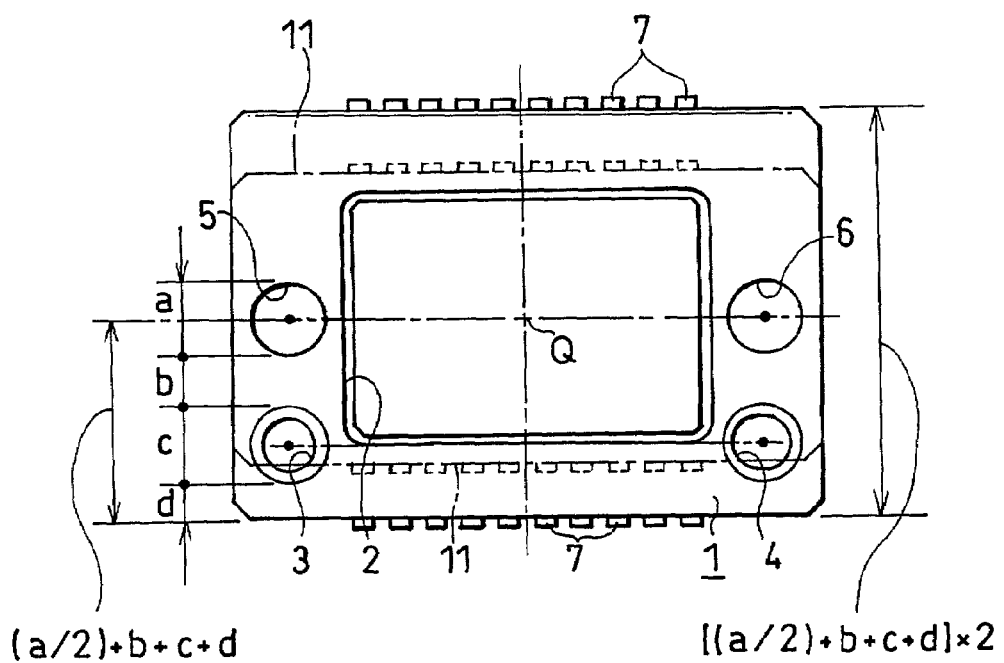
FIG. 3 is a plane view showing a conventional example of a package for containing a solid-state imaging element.

A short side of the package 11 can be (a+b+c+2d) when a diameter of the attaching holes 5 and 6 is designated by notation "a", an interval to be provided between the attaching holes 5 and 6 and the positioning holes 3 and 4 is designated by notation "b", a diameter of the positioning holes 3 and 4 is designated by notation "c" and a distance to be provided between the positioning holes 3 and 4 and one side of the package is designated by notation "d". That is, the length of the short side needs to be 2*{(a/2)+b+c+d} in the conventional example 1 shown in FIG. 3, and can significantly be shortened to the length of (a+b+c+2d). Thus, the size of the package 11 can be reduced by that amount. Further, in FIG. 3, a line 11 indicated by a one-dotted chain line shows an outer shape of the package according to the embodiment to thereby enable to compare sizes of the conventional example and the embodiment.

The package 11 can be reduced in this way by reason nothing but as follows. The respective positioning holes 3 and 4 and the respective attaching holes 5 and 6 are arranged such that the line $1_{34}$ and the line $1_{56}$ are intersected with each other at the center "Q" of the package 11 per se and therefore, there can be eliminated useless space of the attaching hole forming portion opposed to the positioning holes present in the conventional example shown by FIG. 3.

Figure 2A:
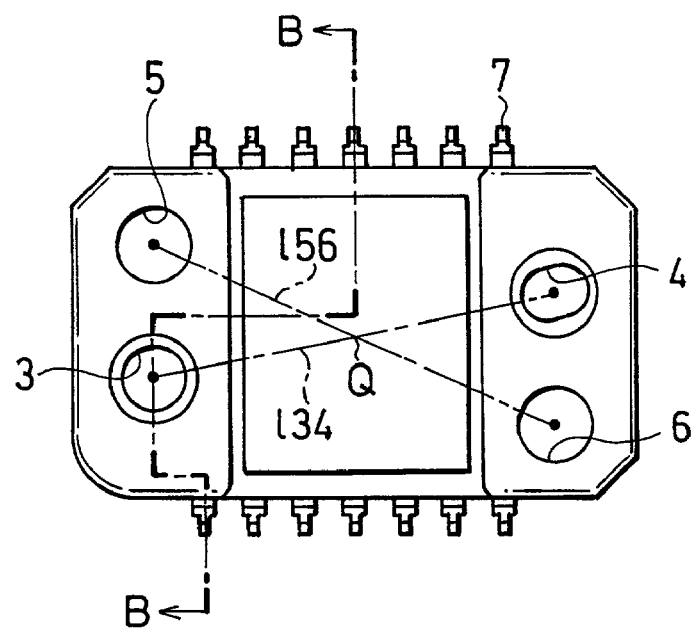
FIG. 2A is a plane view showing an embodiment of a solid-state imaging device according to the invention.
Figure 2B:
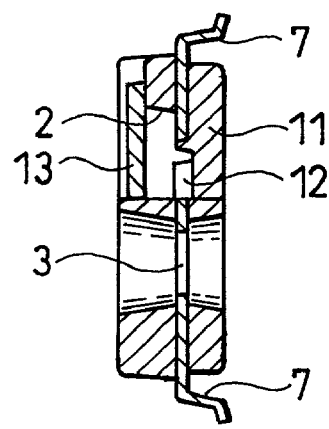
FIG. 2B is a sectional view taken along a line B—B of FIG. 2A showing the embodiment of the solid-state imaging device according to the invention and FIG. 2C is a side view of the embodiment of the solid-state imaging device according to the invention.
Figure 2C:
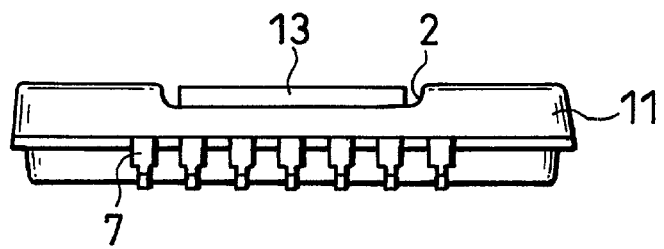

FIG. 2A through FIG. 2C show an example of a solid-state imaging device containing the solid-state imaging element in the package according to the invention and sealing the solid-state imaging element by a transparent member (an embodiment of the solid-state imaging device according to the invention), FIG. 2A is a plane view, FIG. 2B is a sectional view taken along a line B—B of FIG. 2A and FIG. 2C is a side view. Further, in FIG. 2A through FIG. 2C, portions common to those in FIG. 1 are attached with the same notations and a portion which does not appear in FIG. 1 and a portion which is not present in the package 11, are attached with new notations. Hence, an explanation will be given of only portions attached with new notations.

Numeral 12 designates a solid-state imaging element contained in the recess portion 2 and electrodes thereof are connected to inner end portions of the leads 7 via wires illustration of which are omitted for convenience. Numeral 13 designates a transparent member, for example, a glass plate for sealing the solid-state imaging element 12 at inside of the recess portion 2.

Further, as shown by FIG. 2B and FIG. 2C, heights of surfaces of both side portions of the recess portion 2 for sealing the solid-state imaging element 12, are made to be higher than a height of the transparent member 13. The reason is that in this way, when a lens cabinet is attached to a surface of the package, the lens cabinet can effectively be prevented from being brought into contact with the transparent member, further, there can be eliminated a concern that the lens cabinet is attached incorrectly by extruded adhering agent for adhering the bottom surface of the transparent member to the containing portion.

According to the solid-state imaging device of FIG. 2A through FIG. 2C, the solid-state imaging element 12 is contained in the package 11 according to the invention as shown by FIG. 1 and is sealed by the transparent member 13 and therefore, advantages provided to the package 11 can be enjoyed as they are and a size thereof relative to the solid-state imaging device can considerably be made smaller than that of the conventional one.

What is claimed is:

1. A package for containing a semiconductor element comprising:
    a housing containing a semiconductor element; and
    a pair of positioning holes and a pair of attaching holes respectively provided at opposed side portions of said housing;
    wherein a line between said pair of positioning holes and a line between said pair of attaching holes intersect with each other substantially at a center of said package and further wherein the line between the positioning holes is skewed with respect to each of four primary side walls of the housing and the line between the attaching holes is skewed with respect to each of the four primary side walls such that the line between the positioning holes and the line between the attaching holes are each neither parallel nor perpendicular to any of the primary side walls,
    and further wherein the line between said pair of positioning holes is a straight line between centers of the positioning holes and is skewed with respect to each of four primary side walls of the housing and the line between said pair of attaching holes is a straight line between the centers of the attaching holes and is skewed with respect to each of four primary side walls such that the line between the positioning holes and the line between the attaching holes are each neither parallel nor perpendicular to any of the primary side walls, and neither line is located at a center line of the device which is perpendicular to the primary side walls.

2. The package according to claim 1:
    wherein said semiconductor element is a solid-state imaging element.

3. A semiconductor device comprising:
    a semiconductor element;
    a housing containing said semiconductor element; and
    a pair of positioning holes and a pair of attaching holes respectively provided at opposed side portions of said housing;
    wherein a line between said pair of positioning holes and a line connecting said pair of attaching holes are intersected with each other substantially at a center of said package,
    and further wherein the line between said pair of positioning holes is a straight line between centers of the positioning holes and is skewed with respect to each of four primary side walls of the housing and the line between said pair of attaching holes is a straight line between the centers of the attaching holes and is skewed with respect to each of four primary side walls such that the line between the positioning holes and the line between the attaching holes are each neither parallel nor perpendicular to any of the primary side walls, and neither line is located at a center line of the device which is perpendicular to the primary side walls.

4. The semiconductor device according to claim 3,
    wherein said semiconductor element is a solid-state imaging element.

5. A semiconductor device comprising:
    a semiconductor element;
    a housing containing said semiconductor element,
    a pair of attaching holes and a pair of positioning holes respectively provided at opposed side portions of said housing at a surface of said package; and
    a transparent member for sealing said semiconductor element in said recess portion;
    wherein said surface of said package is made to be higher than a top surface of said transparent member.
    and further wherein a line between said pair of positioning holes is a straight line between centers of the positioning holes and is skewed with respect to each of four primary side walls of the housing and a line between the pair of attaching holes is a straight line between the centers of the attaching holes and is skewed with respect to each of four primary side walls such that the line between the positioning holes and the line between the attaching holes are each neither parallel nor perpendicular to any of the primary side walls, and neither line is located at a center line of the device which is perpendicular to the primary side walls.

6. The semiconductor device according to claim 5,
    wherein said semiconductor element is a solid-state imaging element.

7. A package containing a semiconductor element comprising:
    a housing containing a semiconductor element; and
    a pair of positioning holes and a pair of attaching holes respectively provided at opposed side portions of said housing;
    wherein a line between said pair of positioning holes and a line between said pair of attaching holes intersect with each other substantially at a center of said package and further wherein the line between the positioning holes is skewed with respect to each of four primary side walls of the housing and the line between the attaching holes is skewed with respect to each of the four primary side walls such that the line between the positioning holes and the line between the attaching holes are each neither parallel nor perpendicular to any of the primary side walls, and further wherein the package is generally rectangular in shape and one positioning hole and one attaching hole is located on a first side of the package, and the second positioning hole and the second attaching hole are located on the opposite side such that the positioning holes are diametrically opposed in generally opposite quadrants of the package and the attaching holes are diametrically opposed in opposite quadrants of the package and a line generally bisecting the package in a central portion thereof separates the positioning holes and attaching holes, wherein the line between said pair of positioning holes is a straight line between centers of the positioning holes and is skewed with respect to each of four primary side walls of the housing and the line between said pair of attaching holes is a straight line between the centers of the attaching holes and is skewed with respect to each of four primary side walls such that the line between the positioning holes and the line between the attaching holes are each neither parallel nor perpendicular to any of the primary side walls, and neither line is located at a center line of the device which is perpendicular to the primary side walls.

8. A semiconductor device comprising:

a semiconductor element;

a housing containing said semiconductor element, the housing being comprised of two pairs of generally parallel primary side walls, the primary side walls being substantially mutually perpendicular, and each defining one of the largest four boundaries of said housing; and a pair of positioning holes and a pair of attaching holes, one member of each pair of positioning holes and attaching holes being respectively provided at one of said opposed primary side walls of said housing;

wherein a line bisecting substantially a center of the housing is perpendicular to each of the primary side walls at which the positioning holes and attaching boles are located, each of the positioning holes and attaching holes being located at a portion of the sidewall on a side of the line bisecting substantially the center of the housing such that no portion of any positioning hole or attaching hole crosses the line and none of the positioning holes or attaching holes shares a same side of a primary side wall.

9. A semiconductor device comprising:

a semiconductor element;

a housing containing said semiconductor element, the housing being comprised of two pairs of generally parallel primary side walls, the primary side walls being substantially mutually perpendicular, and each defining one of the largest four boundaries of said housing; and a pair of positioning holes and a pair of attaching holes, one member of each pair of positioning holes and attaching holes being respectively provided at one of said opposed primary side walls of said housing;

wherein a diameter of an attaching hole at a first primary side wall is defined to be a dimension a a diameter of a positioning hole at the first primary side wall is defined to be a dimension c a shortest interval between the attaching hole and the positioning hole is a dimension b and a shortest distance from the positioning hole at the first primary side wall and its closest intersection with an adjacent primary side wall is a dimension d, and wherein the length of the first primary side wall is substantially equal to:

$a+b+c+(d\times 2)$.

* * * * *